United States Patent
Hoeing et al.

(10) Patent No.: US 6,961,233 B2
(45) Date of Patent: Nov. 1, 2005

(54) MODULE FOR ELECTRICAL APPARATUS, PARTICULARLY, A FIELD BUS MODULE

(75) Inventors: Michael Hoeing, Lemgo (DE); Thorsten Wuensche, Leopoldshoehe (DE); Walter Hanning, Detmold (DE)

(73) Assignee: Weidmüller Interface GmbH & Co., Detmold (DE)

( * ) Notice: Subject to any disclaimer, the term of this patent is extended or adjusted under 35 U.S.C. 154(b) by 212 days.

(21) Appl. No.: 10/616,183

(22) Filed: Jul. 10, 2003

(65) Prior Publication Data

US 2004/0024939 A1 Feb. 5, 2004

(30) Foreign Application Priority Data

Jul. 19, 2002 (DE) .................................... 202 11 002 U (51) Int. Cl.$^7$ ................................................ H05K 7/02
(52) U.S. Cl. ...................... 361/622; 361/735; 439/76.1; 307/147
(58) Field of Search ............................... 361/622, 731, 361/735, 732, 733, 744, 790, 752, 785; 439/76.1, 716, 712–713, 715, 76.2, 717–718, 61, 631, 67, 928, 52, 709, 218; 307/147

(56) References Cited

U.S. PATENT DOCUMENTS

| | | | |
|---|---|---|---|
| 4,790,762 A | * 12/1988 | Harms et al. .................. | 439/59 |
| 4,995,818 A | * 2/1991 | Saimoto ....................... | 439/74 |
| 5,322,445 A | * 6/1994 | Ozaki et al. ................. | 439/212 |
| 5,472,347 A | * 12/1995 | Nordenstrom et al. ........ | 439/61 |
| 5,588,881 A | 12/1996 | Eggert | |
| 5,615,079 A | 3/1997 | Eggert | |
| 5,629,831 A | 5/1997 | Eggert | |
| 5,722,862 A | 3/1998 | Glathe | |
| 5,897,399 A | * 4/1999 | Emery ......................... | 439/709 |
| 5,984,734 A | * 11/1999 | Piper et al. .................. | 439/717 |
| 6,081,048 A | * 6/2000 | Bergmann et al. .......... | 307/147 |
| 6,196,862 B1 | * 3/2001 | Dooley ....................... | 439/412 |
| 6,210,179 B1 | * 4/2001 | Lausberg et al. ........... | 439/76.1 |
| 6,392,319 B1 | * 5/2002 | Zebermann et al. ........ | 307/147 |

FOREIGN PATENT DOCUMENTS

| | | |
|---|---|---|
| DE | 37 40 290 A1 | 6/1989 |
| DE | 296 07 525 U1 | 8/1996 |
| DE | 196 10 559 A1 | 9/1997 |
| DE | 196 16 551 A1 | 10/1997 |
| DE | 196 51 961 A1 | 6/1998 |
| DE | 197 48 530 A1 | 4/1999 |
| DE | 197 48 531 A1 | 5/1999 |
| DE | 198 07 710 A1 | 9/1999 |
| DE | 101 31 172 A1 | 1/2002 |
| WO | WO 00 62 376 A1 | 10/2000 |

* cited by examiner

*Primary Examiner*—Michael Datskovskiy
(74) *Attorney, Agent, or Firm*—Lawrence E. Laubscher, Sr.; Lawrence E. Laubscher, Jr.

(57) ABSTRACT

A field bus module assembly includes a generally rectangular base module adapted for mounting on a fixed support, an input/output module, and a connecting module for connecting the input/output module with the base module, the base module including a lateral projecting portion adapted for insertion in sealed relation within a corresponding recess contained in the base module of an adjacent assembly. The base module includes a housing formed of a synthetic plastic insulating material, a plurality of bus bar conductors mounted on the housing, a protective cover member covering the bus bar conductors, and a mass of encapsulating material hermetically sealing the space around the cover.

18 Claims, 7 Drawing Sheets

MODULE FOR ELECTRICAL APPARATUS, PARTICULARLY, A FIELD BUS MODULE

BACKGROUND OF THE INVENTION

1. Field of the Invention

This invention relates to a field bus module assembly including a base module adapted for connection to a fixed support, and input/output module, and a connecting module for connecting the input/output module to the base module, characterized that sealing masses and sealing beads are provided for hermetically sealing the base and connecting modules against moisture.

2. Brief Description of the Prior Art

Electrical power distribution and communications systems including electrical and/or electronic modules are well know in the patented prior art, as shown by the instant Applicant's prior U.S. patents to Eggert, et al., U.S. Pat. Nos. 5,588,881, 5,615,079, and 5,629,831, and Glathe, et al., U.S. Pat. No. 5,722,862, among others.

As shown by the German patent No. DE 37 40 290, it is also known to provide base modules with bus bar contacts that may be arranged in a row on a mounting rail in step-by-step relation. Housings with electronic equipment with external connections to actuators, sensors and the like may then be connected with the base modules.

In the International Application No. WO 00/62376, there is disclosed a connection unit having an input/output electronics module mounted thereon by plug connector means, which assembly is arranged for mounting on a support rail.

In designing such electrical devices and systems, it has proven desirable for the field bus modules, together with the so-called "gateway" or entrance modules, and the power supply modules, to be protected against the penetration of moisture. In particular, the devices are to be protected against the penetration of water according to Industry Standard EP 67.

SUMMARY OF THE INVENTION

Accordingly, a primary object of the present invention is to provide a field bus base module assembly that is hermetically sealed and is substantially impervious to water. In accordance with the present invention, the assembly includes a base module adapted to be secured to a fixed support, an input/output unit, and a connecting unit connecting the input/output unit to the base unit, characterized in that the chamber containing the bus bar contacts is closed by a cover member and is hermetically sealed by a first mass of conventional encapsulating material.

According to another object of the invention, the base modules are sealed by themselves standing alone, and then the modules are connected together by further sealing means, thereby to avoid the penetration of moisture to achieve protection of Industry Standard IP67. To this end, at least one row of the contact boreholes is surrounded by a groove that contains a compressible sealing bead that is engaged by a corresponding rib on the housing of another unit, thereby further enhancing the sealing effect.

Still another object of the invention is to provide a sealing frame that is mounted in the connecting module for receiving the connector connecting pins, together with a second sealing mass of encapsulating material that further seals the assembly against moisture. By way of a simple design feature, the sealing frame also facilitates a watertight design and makes it easier to cast the sealing material therein.

BRIEF DESCRIPTION OF THE DRAWINGS

Other objects and advantages of the invention will become apparent from a study of the following specification when viewed in the light of the accompanying drawings, in which.

DETAILED DESCRIPTION

Figure 1A:
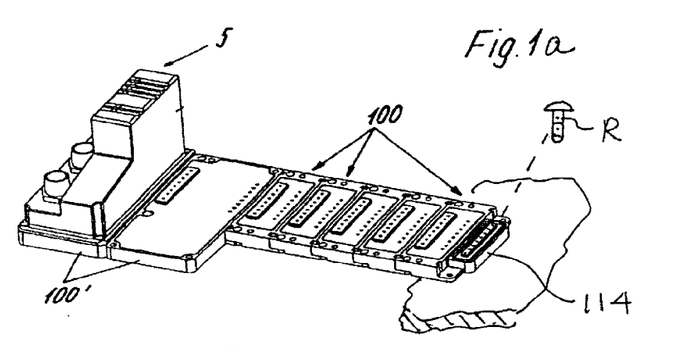
FIGS. 1a–1f are front perspective views illustrating the assembly steps for assembling an electrical system using the field bus module assembly of the present invention.
Figure 1B:
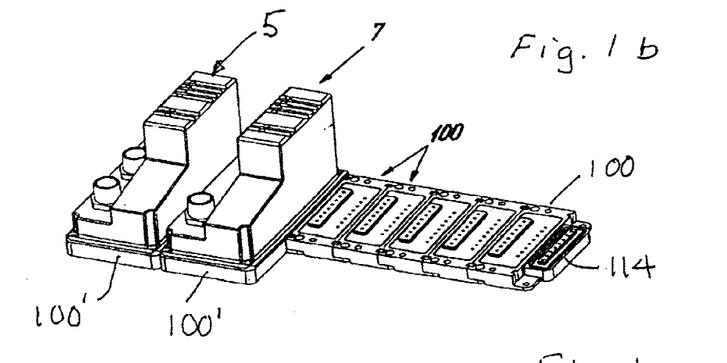
Figure 1C:
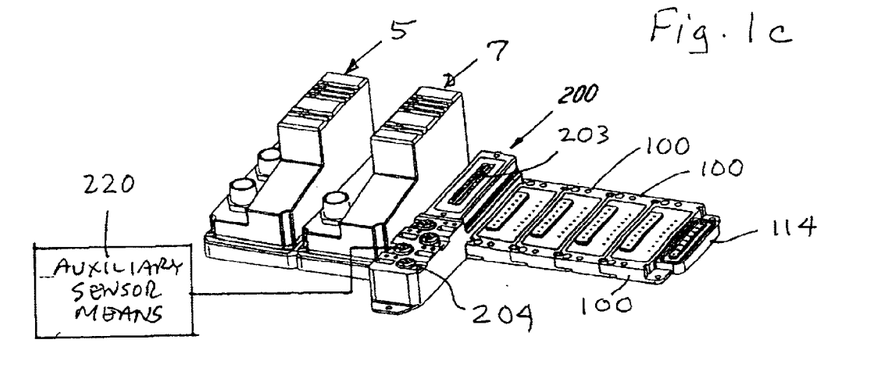
Figure 1D:
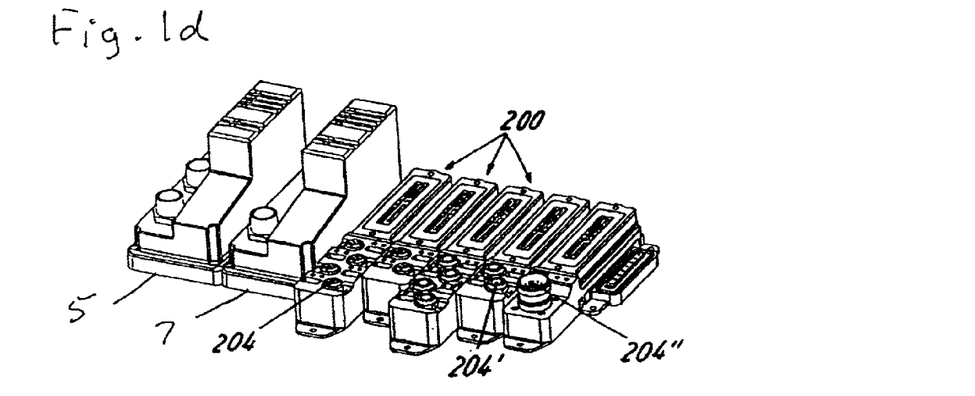
Figure 1E:
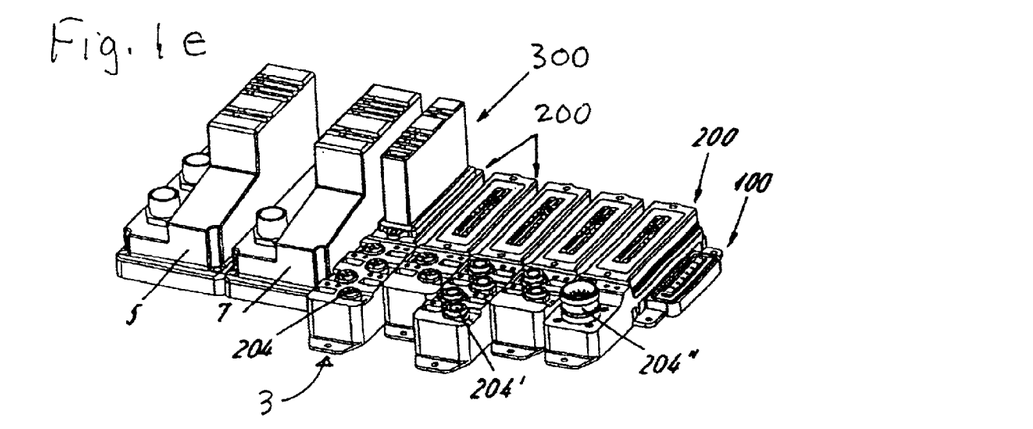
Figure 1F:
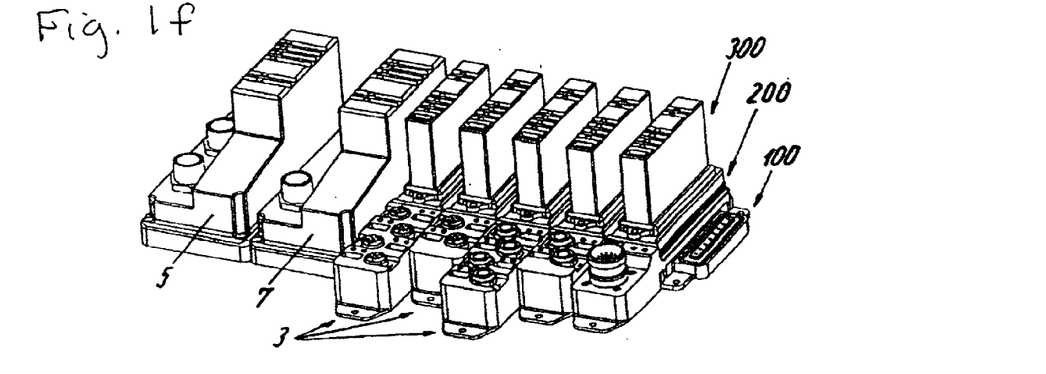

Referring now to FIG. 1a, the electrical system includes a plurality of base module units 100 that are connected together in side-by-side relation. The base module units are connected with a pair of larger base module units 100' that support the so-called "gateway" or input module 5 and the power supply module 7, respectively, as shown in FIG. 1b. As shown in FIG. 1c, the connecting module 200 is mounted upon an associated one of the base modules 100. The base module 200 is provided with a plug connector 203, and a plurality of connectors 204 adapted for connection with auxiliary sensor or control means 220. As shown in FIG. 1d, a plurality of the connecting modules 200 may be mounted on the base module 100 respectively, the connecting modules being provided with different types of auxiliary connectors 204' and 204", as desired. As shown in FIG. 1e, an input/output module 300 is then mounted on the first connecting module 200, and additional input/output modules may be mounted on the remaining connecting units 200 of the assembly as best shown in FIG. 1f. Thus, a plurality of the field bus module assemblies 3 of the present invention may be laterally connected with the gateway 5 and power supply means 7, as shown in FIG. 1f.

Figure 2:
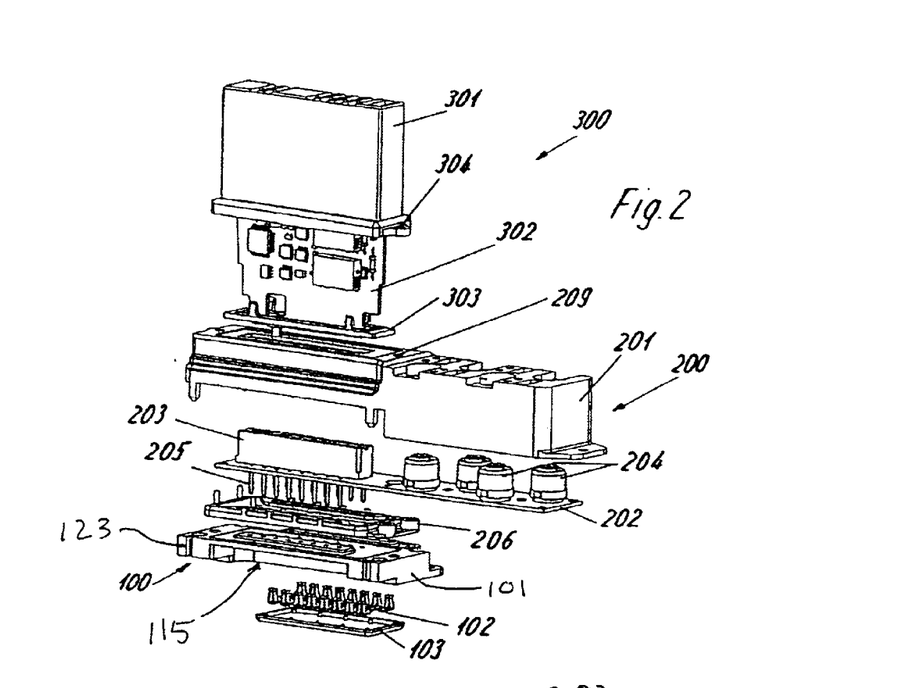
FIG. 2 is an exploded view of a field bus module assembly of the present invention.

Referring now to the exploded view of FIG. 2, the base module 100 includes a housing 101 containing a recess 115 defused in an edge portion between the bottom wall and the associated vertical side wall. Mounted in the recess 115 are a plurality of bus bar connectors 102, which are covered by a cover plate 103. The connecting unit 200 includes a housing 201 having a bottom chamber in which is mounted the connecting printed circuit board 202 on which are mounted the plug connector 203 and a plurality of connecting plugs 204. It will be seen that the plug connector 203 includes a plurality of downwardly projecting contact pins 205 that extend through the central opening of a rectangular sealing frame 206 into contact with the bus contacts 102, as will be described in greater detail below. The plug connector 203 is connected with the printed circuit board 302 of the input/output module 300. The input/output module 300 includes a cover member 301 having a mounting flange 304, and the printed circuit board 302 is provided with a base plate 303 that is seated within a corresponding recess 209 contained in the upper surface of the connecting module housing 201.

Figure 3A:
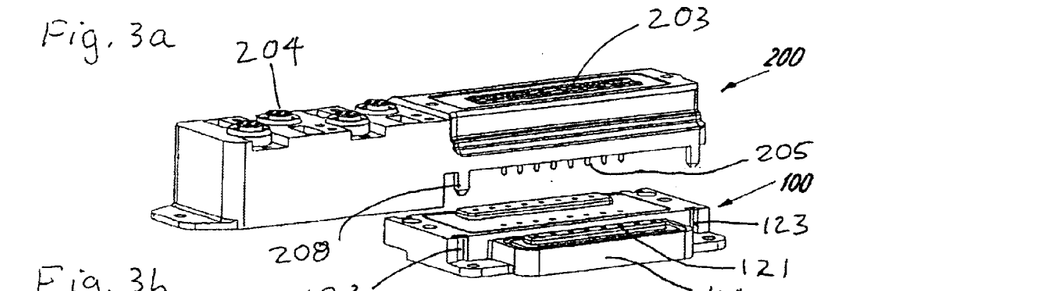
FIGS. 3a and 3b are front perspective views illustrating the steps of assembling a connecting module to a base module in accordance with the present invention.
Figure 3B:
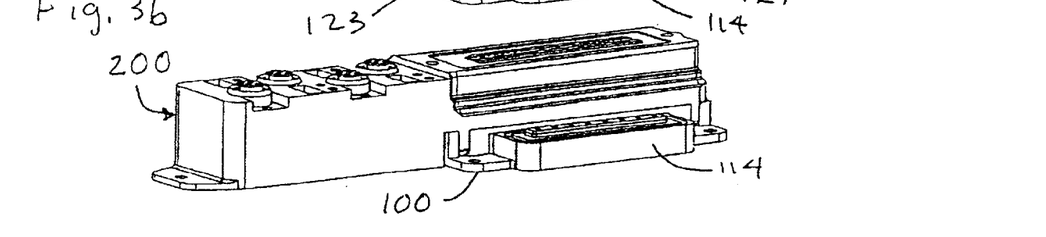

As shown in FIGS. 3a and 3b, the connecting unit 200 is seated downwardly upon the base module 100, with locating pins 208 extending within corresponding locating recesses 123 contained in the base module 100.

Figure 4A:
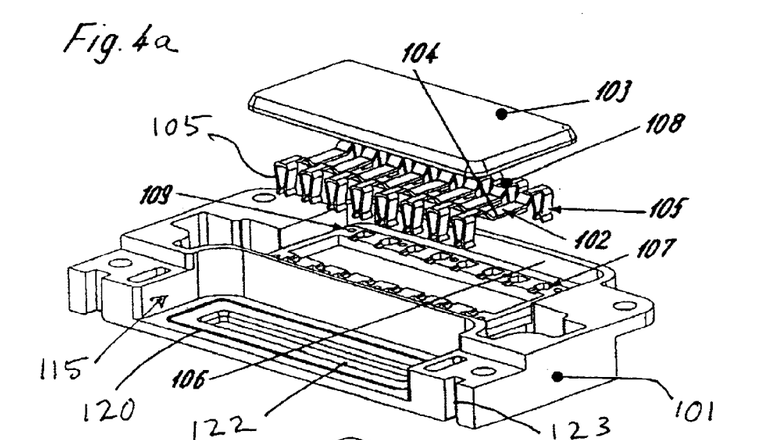
FIGS. 4a–4c are bottom perspective views illustrating the steps for installing the cover member and for subsequently applying the sealing mass on the bottom of the base module.
Figure 4B:
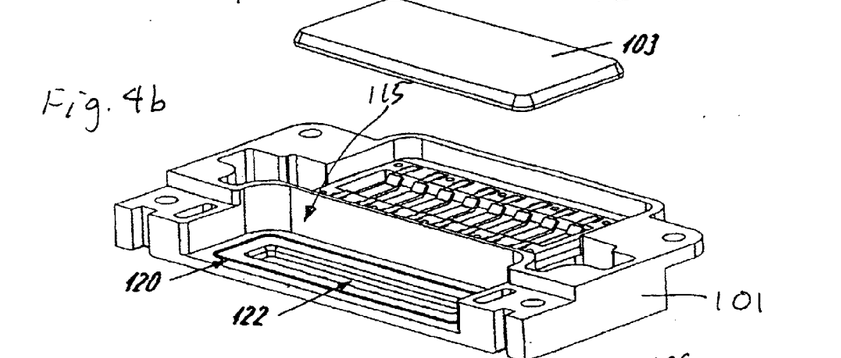
Figure 4C:
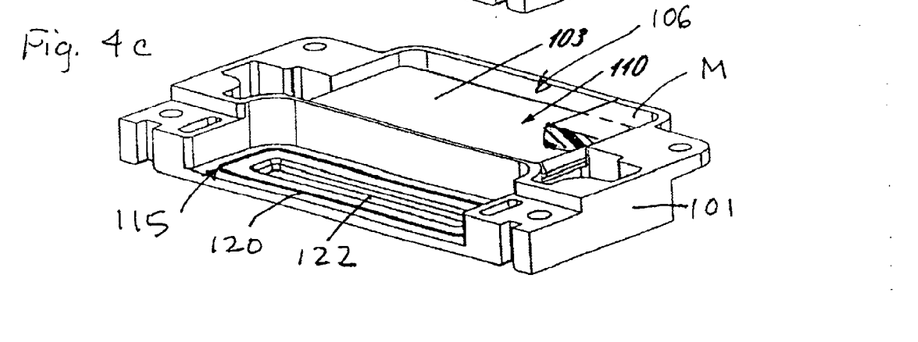

Referring now to FIGS. 4a–4c, the bottom wall of the base module housing 101 contains aforementioned the first recess 115, and a second recess 106 that receives the bus contacts 102 and the cover 103. Each of the bus contacts 102 includes a horizontal flat central bus bar portion 104 connected at each end to a tulip-shaped female resilient terminal 105. The terminal 105 extend through corresponding throughbore pockets 107 for engagement by the contact ends 205 of the connecting module 200, as will be described in greater detail below. As shown in FIG. 4c, the cover member 103 is spaced from the bottom edge of the base module housing 101, thereby to define a filling chamber 110 that is completely filled with a first mass M of an encapsulating material that hermetically seals the space below the bus bar contacts 102.

Figure 4D:
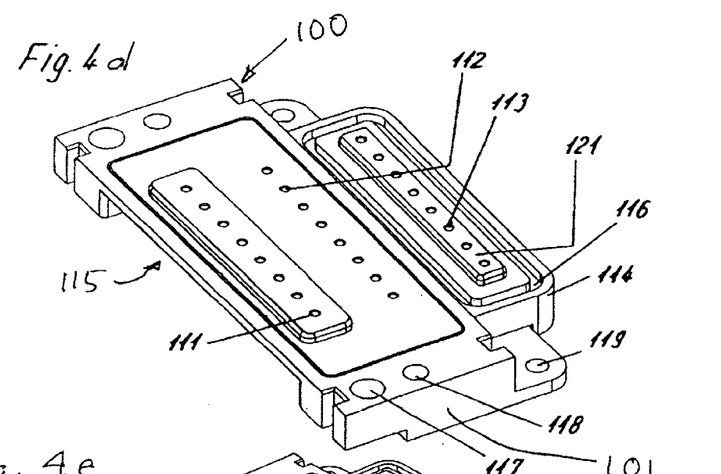
FIGS. 4d–4f are top perspective views illustrating the steps for laterally connecting together a plurality of the base modules of the present invention.
Figure 4E:
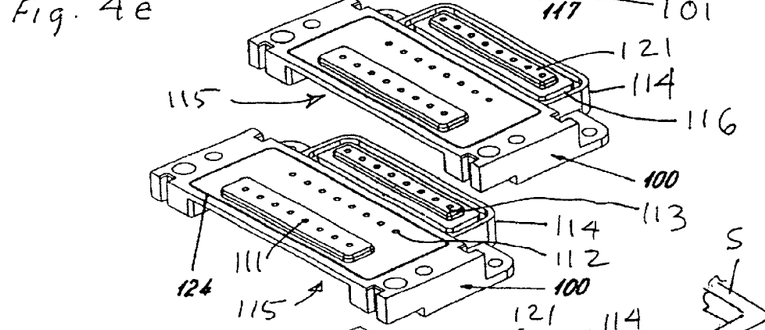
Figure 4F:
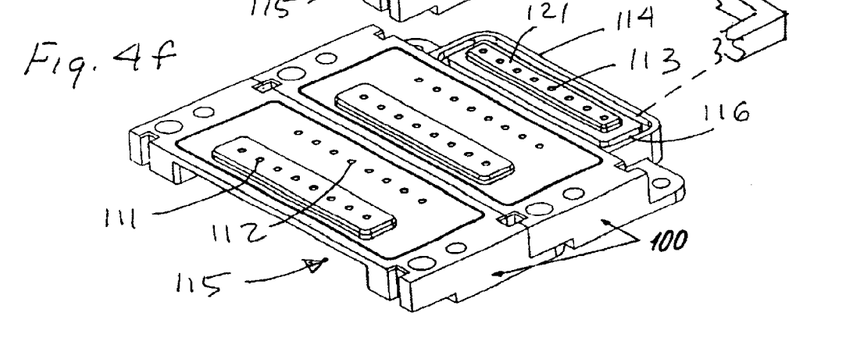

Referring to FIGS. 4d–4f, the upper surface of the base module 101 is provided with two rows of apertures 112 and 113 that are opposite and communicate with the resilient tulip-shaped contacts 105 of the bus bar segments, respectively. The apertures 113 are arranged in an elevated portion 121 that is provided on the laterally-projecting portion 114 of the base module housing 101. A further row of apertures 111 is provided above the recess 115, whereupon when a pair of modules 100 are laterally assembled as shown in FIGS. 4e and 4f, the apertures 111 extend above corresponding apertures 113 of the associated module 100. The base module 100 is provided with a first groove 116 that extends concentrically about the raised portion 121 containing the through boreholes 113. As shown in FIG. 4f, a resilient continuous seal member S is inserted within the groove 116, whereupon when the projecting portion 114 is received within the recess 115 of an adjacent module, a sealing rib 120 (FIGS. 4b and 4c) thereon engages and compresses the sealing member S of the first module, thereby to further protect the assembly against the invasion of moisture.

Figure 4G:
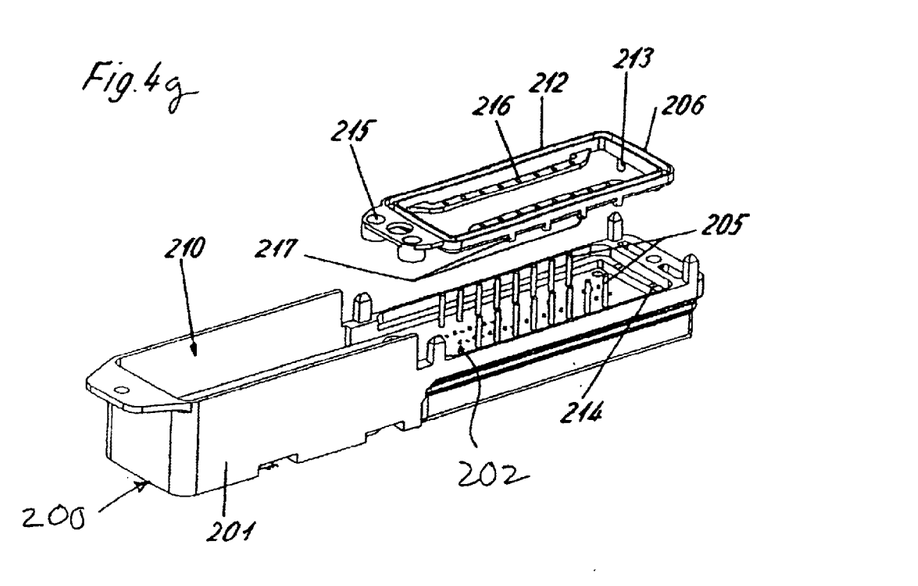
FIGS. 4g and 4h are perspective bottom views illustrating the manner of installation of the sealing frame within the bottom chamber defined within a connecting module in accordance with the present invention.
Figure 4H:
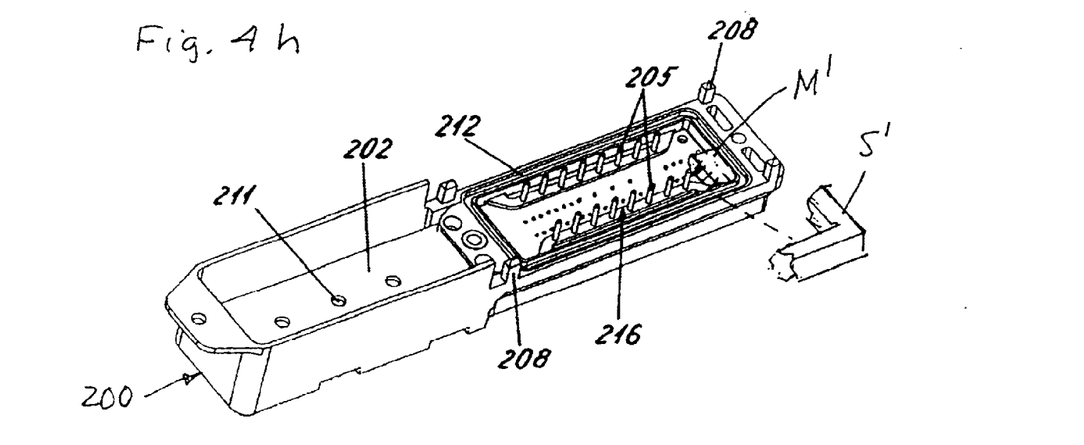

Referring now to FIGS. 4g and 4h, the bottom wall of the connecting module housing 201 is adapted to receive the connecting module printed circuit board 202, with the contact pins 205 extending downwardly from the plug connector 203 on the printed circuit board. Mounted concentrically about the portion of the printed circuit board containing the pins 205 is a sealing frame 206 that is inserted within the chamber 210, with the pins 205 extending through apertures 216 contained in the side plates of the rigid sealing frame 206. The sealing frame is provided with a locating pin 213 that engages in corresponding positioning recess contained in the connecting housing module 201.

In accordance with a characterizing feature of the invention, the sealing frame 206 is provided with a plurality of downwardly extending spacer pins 217 that engage the printed circuit board 203, thereby to space the sealing frame 206 downwardly from the printed circuit board 202. A second mass M' of the encapsulating material is then inserted in the chamber defined within the hollow sealing frame 206, with the sealing material extending outwardly between the sealing frame spacer projections 217. The upper surface of the sealing frame 206 is provided with a groove 212 for receiving a continuous second sealing member S'. The resilient seal S' is compressed by a corresponding rib 124 provided on the upper portion of the module 100, as shown in FIG. 4e.

Figure 4I:
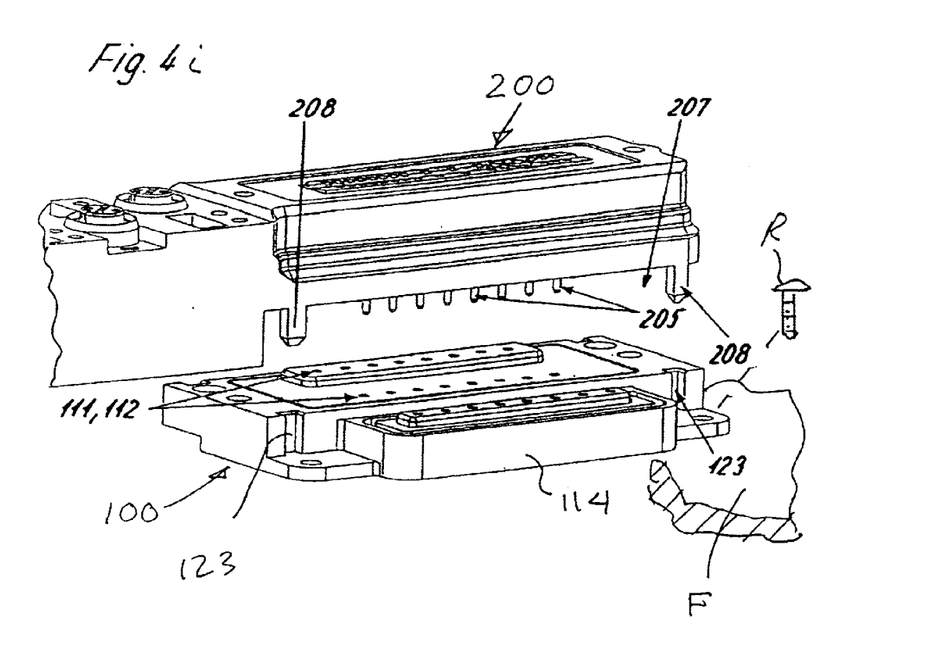
FIGS. 4i and 4j are front perspective views illustrating the assembly of the connecting module to the base module.
Figure 4J:
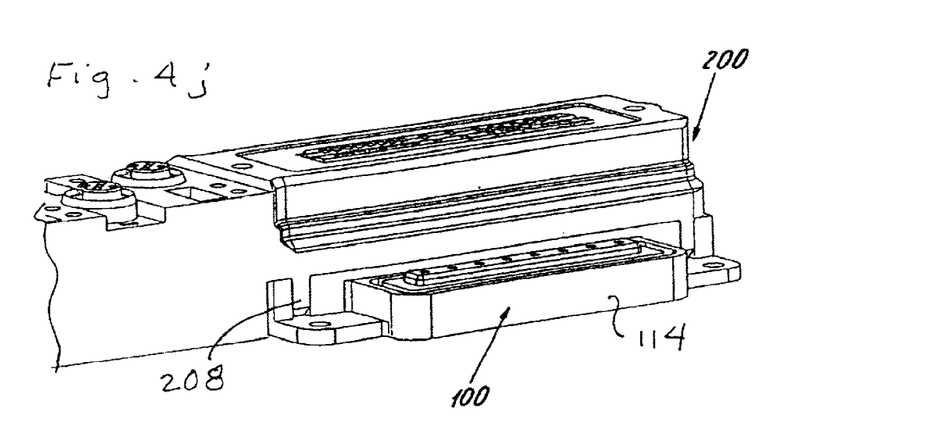

Referring now to FIGS. 4i and 4j, when the connecting module 200 is displaced downwardly relative to the base module 100, the first row of projecting pins 205 extend downwardly into the through bores 112 for engagement with the tulip-shaped terminals 105 at one end of the bus bars 102, respectively. The second row of contact pins 205 extend downwardly through the corresponding through bores 111 for engagement with the tulip-shaped resilient terminals at the other ends of the bus bars 102, respectively. During this downward displacement of the connecting module 200, the locator pins 208 extend downwardly within the corresponding guide slots 123 contained in the wall of the base module housing 101.

Initially, the base module 100 is secured to a fixed support F by the fastening screw R as shown in FIG. 4i, whereupon the connecting module 200 and the input/output module are successively connected to define the assembly.

The electrically insulating sealing masses M and M' of FIGS. 4c and 4h, respectively, are formed of a suitable castable synthetic plastic material, such as a polyurethane.

While in accordance with the provisions of the Patent Statutes the preferred forms and embodiments of the invention have been illustrated and described, it will be apparent to those skilled in the art that various changes and modifications may be made without deviating from the inventive concepts set forth above.

What is claimed is:

1. A field bus module assembly, comprising:
   (a) a generally rectangular base module (100) adapted for connection with a fixed horizontal support;
   (b) an input/output module (300); and
   (c) a generally rectangular connecting module (200) mounting said input/output module on said base module;
   (d) said base module including:
      (1) a base body (101) formed of synthetic plastic electrical insulating material, said base body having a lateral projecting portion (114) that is adapted to extend within a corresponding lateral recess (115) contained in an adjacent second base module, said base body having a horizontal lower surface containing an upwardly extending second recess (106) having a top wall;
      (2) a plurality of bus bar electrical contacts (102) mounted in transversely-arranged, laterally-spaced relation within said second recess adjacent said top wall;
      (3) a horizontal cover member (103) arranged in said second recess below said bus bar electrical contacts, said cover member being spaced upwardly above the horizontal plane containing said base body lower surface, thereby to define a chamber (110) in the bottom portion of said second recess; and
      (4) a first mass of encapsulating material (M) filling said chamber, thereby to hermetically seal said bus bar electrical contacts against moisture.

2. A field bus module assembly as defined in claim 1, wherein said input/output module includes a printed circuit board (302); and further wherein said connecting module includes:
   (1) a connecting module printed circuit board (202);
   (2) first electrical connector means (203) mounted on said connecting module printed circuit board for connecting said base module contacts with said input/output circuit board; and (3) second connector means (204) for connecting said base module contacts with auxiliary sensor means.

3. A field bus module assembly as defined in claim 2, wherein said input/output module includes:
(1) a base (303) supporting said input/output printed circuit board; and
(2) cover means (301) covering said input/output printed circuit board.

4. A field bus module assembly as defined in claim 1, wherein said first recess (115) is contained in the edge between said bottom wall and one side wall of said base module, whereby when a plurality of said base modules are laterally connected in a row, the end base module of the row can be disconnected from the adjacent base module only by vertical displacement of said end base module.

5. A field bus module assembly as defined in claim 4, wherein said base module projecting portion (114) carries an upwardly projecting portion (121) that is adapted to extend within a corresponding recess (122) contained in the top wall of the first recess contained in the adjacent base module.

6. A field bus module assembly as defined in claim 1, wherein said base module projecting portion (114) contains a first row of transversely arranged first through bores (113) opposite corresponding ends of said bus bar electrical contacts, respectively, and wherein the portion of said base module containing said first recess contains a transversely arranged second row of second through bores (111) parallel with said first through bores, said second through bores being arranged for communication with the first through bores of an adjacent assembled base module.

7. A field bus module assembly as defined in claim 6, wherein said base module contains a third row of transversely arranged third through bores (112) between and parallel with said first and second rows of through bores, the other ends of said bus bar electrical contacts being arranged beneath said third through bores, respectively; and further wherein said connecting module (200) includes:
(1) a horizontal connecting module printed circuit board (202); and
(2) a plug connector (203) carried by said connecting module printed circuit board, said plug connector having two rows of transversely arranged vertical contact pins (205) opposite and extending through said second and third through bores, respectively.

8. A field bus module assembly as defined in claim 7, wherein said bus bar electrical contacts (102) include horizontal center portions (104), and resilient tulip-shaped female terminals (105) that extend upwardly from the ends of said bus bar electrical contacts beneath said second and third rows of through bores for engagement by said connecting module vertical contact pins (205), respectively.

9. A field bus module assembly as defined in claim 8, wherein the top wall of said base module second recess (106) contains two rows of transversely arranged through pockets (107) for receiving said tulip-shaped resilient female terminals, respectively.

10. A field bus module assembly as defined in claim 7, wherein said base module second recess contains a plurality of alignment openings (109) for receiving corresponding alignment pins on said cover member, respectively.

11. A field bus module assembly as defined in claim 7, and further wherein said base module contains a continuous groove (116) surrounding at least one row of said through bores (111, 112, 113), and a resilient seal member (S) mounted in said groove, the adjacent base module having a continuous rib (120) opposite said groove for compressing said seal when said base modules are connected together.

12. A field bus module assembly as defined in claim 7, wherein said connecting module further includes:
(3) a rectangular housing (201) the bottom of which contains a chamber (210) receiving said connecting module printed circuit board (202);
(4) a rectangular sealing frame (206) arranged in said chamber beneath said connecting module printed circuit board, said sealing frame extending beneath the periphery of said first electrical connector means (203), said sealing frame having an open center portion defining a second chamber receiving said pin contacts; and
(5) a second mass of encapsulating sealing material (M') filling said second chamber, thereby to hermetically seal the space between said pin contacts.

13. A field bus module assembly as defined in claim 12, wherein said connecting module housing (201) includes a plurality of locator pins (208) that extend toward corresponding recesses (123) contained in the adjacent surface of said base module housing.

14. A field bus module assembly as defined in claim 12, wherein the bottom surface of said sealing frame contains a continuous second groove (212) extending about the periphery thereof, and a second resilient seal member (S') mounted in said second groove.

15. A field bus module assembly as defined in claim 12, wherein said sealing frame includes at least one locator pin (213) arranged for cooperation with a corresponding recess (214) contained in an opposing surface of said connecting module body.

16. A field bus module assembly as defined in claim 12, wherein said sealing frame contains a plurality of through bores (216) receiving said contact pins, respectively, said sealing frame also including a plurality of spacer pins (217) that engage the connecting module printed board to space said sealing frame from said circuit board, said second sealing mass extending within and filling said space and the space between said contact pins, thereby to completely seal and encapsulate the bottom of said connecting module.

17. A field bus module assembly as defined in claim 1, and further including means for securing said base module to the fixed support, means for connecting said connecting module with said base module, and means connecting said input/output module with said base unit via said connecting module.

18. A field bus module assembly as defined in claim 1, and further including a pair of sealing bead means for sealing the connecting module with each of said base and input/output modules, respectively.

\* \* \* \* \*